United States Patent
Nagamine et al.

(10) Patent No.: US 6,272,021 B1
(45) Date of Patent: *Aug. 7, 2001

(54) CIRCUIT DEVICE

(75) Inventors: Akira Nagamine; Ping Chen, both of Aichi (JP)

(73) Assignee: The Whitaker Corporation, Wilmington, DE (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/095,944

(22) Filed: Jun. 11, 1998

(30) Foreign Application Priority Data

Jun. 16, 1997 (JP) .................................................. 9-175304

(51) Int. Cl.[7] ..................................................... H05K 7/14
(52) U.S. Cl. .......................... 361/796; 361/736; 361/737; 361/753; 439/76.1; 439/495
(58) Field of Search ..................................... 361/720–727, 361/733, 736, 737, 747–750, 752–754, 759, 767, 769, 785, 796–801, 802; 439/327, 328, 354, 357, 76.1, 633, 79, 495

(56) References Cited

U.S. PATENT DOCUMENTS

| | | | |
|---|---|---|---|
| 4,811,165 | * 3/1989 | Currier et al. ......................... | 361/736 |
| 5,133,670 | * 7/1992 | Doi et al. .............................. | 439/79 |
| 5,192,220 | * 3/1993 | Billman et al. ....................... | 439/327 |
| 5,389,000 | * 2/1995 | DeViesti et al. ..................... | 439/157 |
| 5,409,385 |   4/1995 | Tan et al. .............................. | 439/76 |
| 5,451,172 | * 9/1995 | Lee Siew Suan et al. .......... | 439/495 |
| 5,659,459 |   8/1997 | Wakabayashi et al. .............. | 361/753 |
| 5,660,568 |   8/1997 | Moshayedi ........................... | 439/654 |
| 5,712,766 | * 1/1998 | Fekdman et al. .................... | 361/737 |
| 5,734,558 | * 3/1998 | Poplawski et al. .................. | 361/752 |
| 5,895,287 | * 4/1999 | Seto et al. ............................ | 439/495 |
| 5,920,460 | * 7/1999 | Oldendorf et al. .................. | 361/753 |

FOREIGN PATENT DOCUMENTS

| | | | | |
|---|---|---|---|---|
| 1595669 | 8/1991 | (GB) | .............................. | H01H/1/58 |

OTHER PUBLICATIONS

Patent Abstract of Japan—JP–A–757830 (Nippon Denso), Application Date & No., Aug. 18, 1993, 5–203988, Laid–Open Date & No. Mar. 3, 1995, 7–57830.

Patent Abstract of Japan—JP–A–8 116178 (Nippon Denso), Application Date & No., Oct. 18, 1994, 6–252450, Laid–Open Date & No., May 7, 1996, 8–116178.

Patent Abstract of Japan—JP–8–185920 (Nippon Denso), Application Date & No., Jan. 5, 1995, 7–153, Laid–Open Date & No., Jul. 16, 1996, 8–185920.

* cited by examiner

*Primary Examiner*—Jeffrey Gaffin
*Assistant Examiner*—Tuan Dinh

(57) ABSTRACT

The present invention provides a circuit device which insures highly-reliable electrical connections even when used in environments involving large temperature variations, and which can be easily assembled. Board assembly (10) has a housing (50) which is mounted on an edge (150) of a circuit board (100). Edge (150) includes protruding sections (160) on which a plurality of contact pads (180) are aligned. The housing (50) accommodates the protruding sections (160) inside slots (52), which are formed inside the housing (50). Reinforcing sections (55) are disposed on both sides along the lengths of the slots (52). A connector, which engages with a mating connector, is formed by the protruding sections (160) and the housing (50). Since the edge (150) of the circuit board (100) is maintained in a substantially flat-plate shape even in cases where deformation caused by heat occurs in other portions of the circuit board (100), highly reliable electrical connections with mating connectors can be realized.

12 Claims, 5 Drawing Sheets

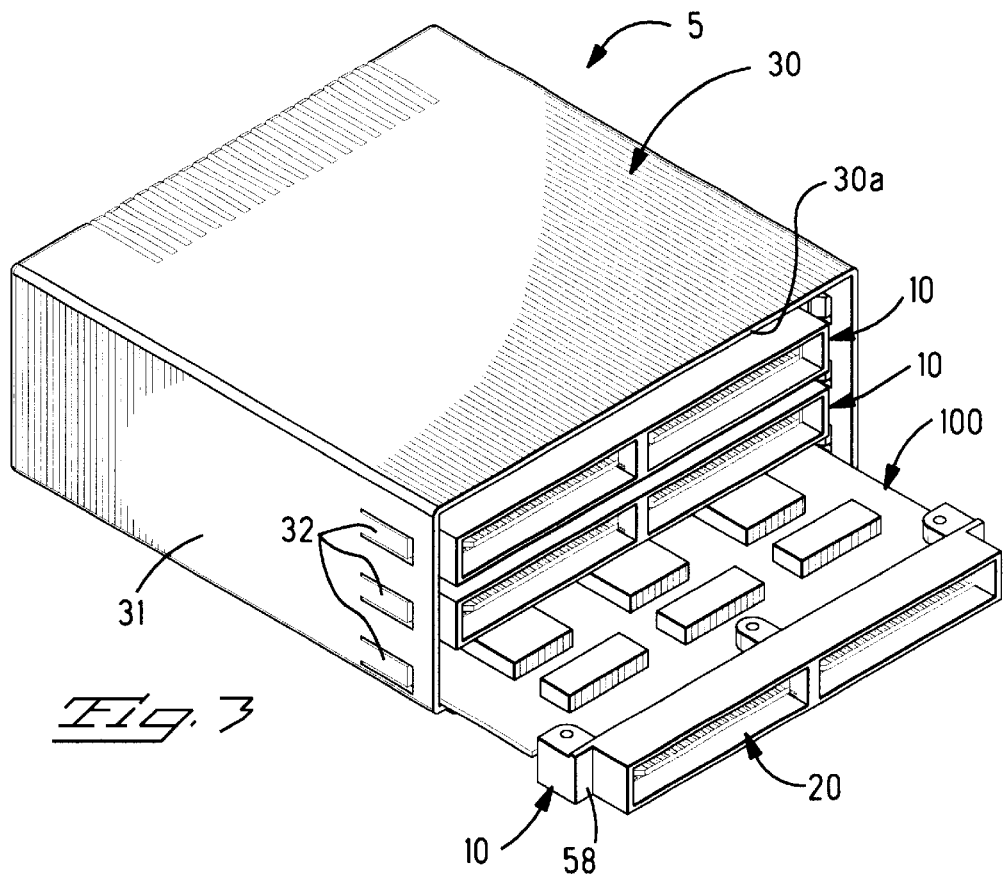
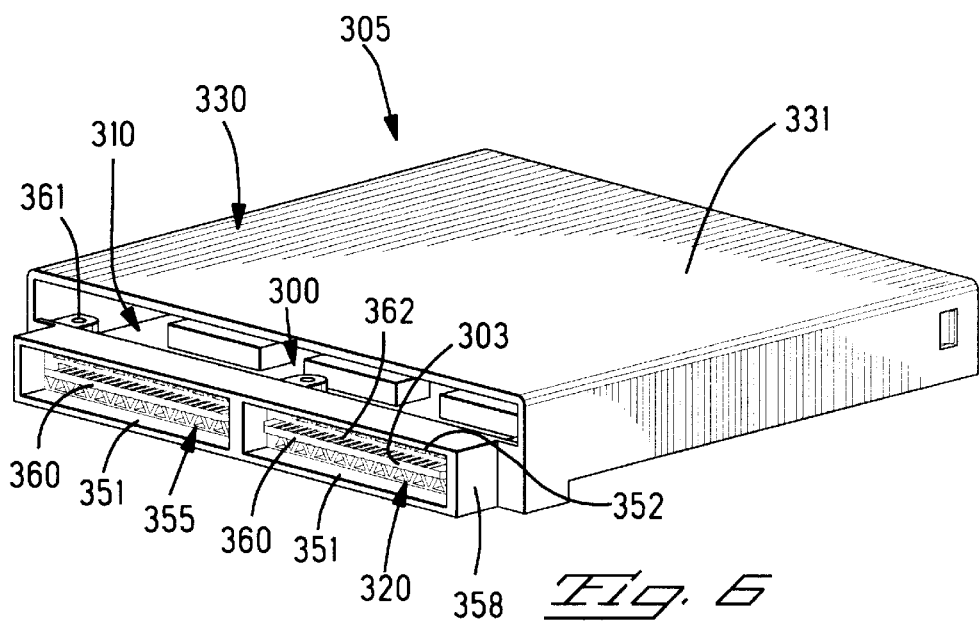

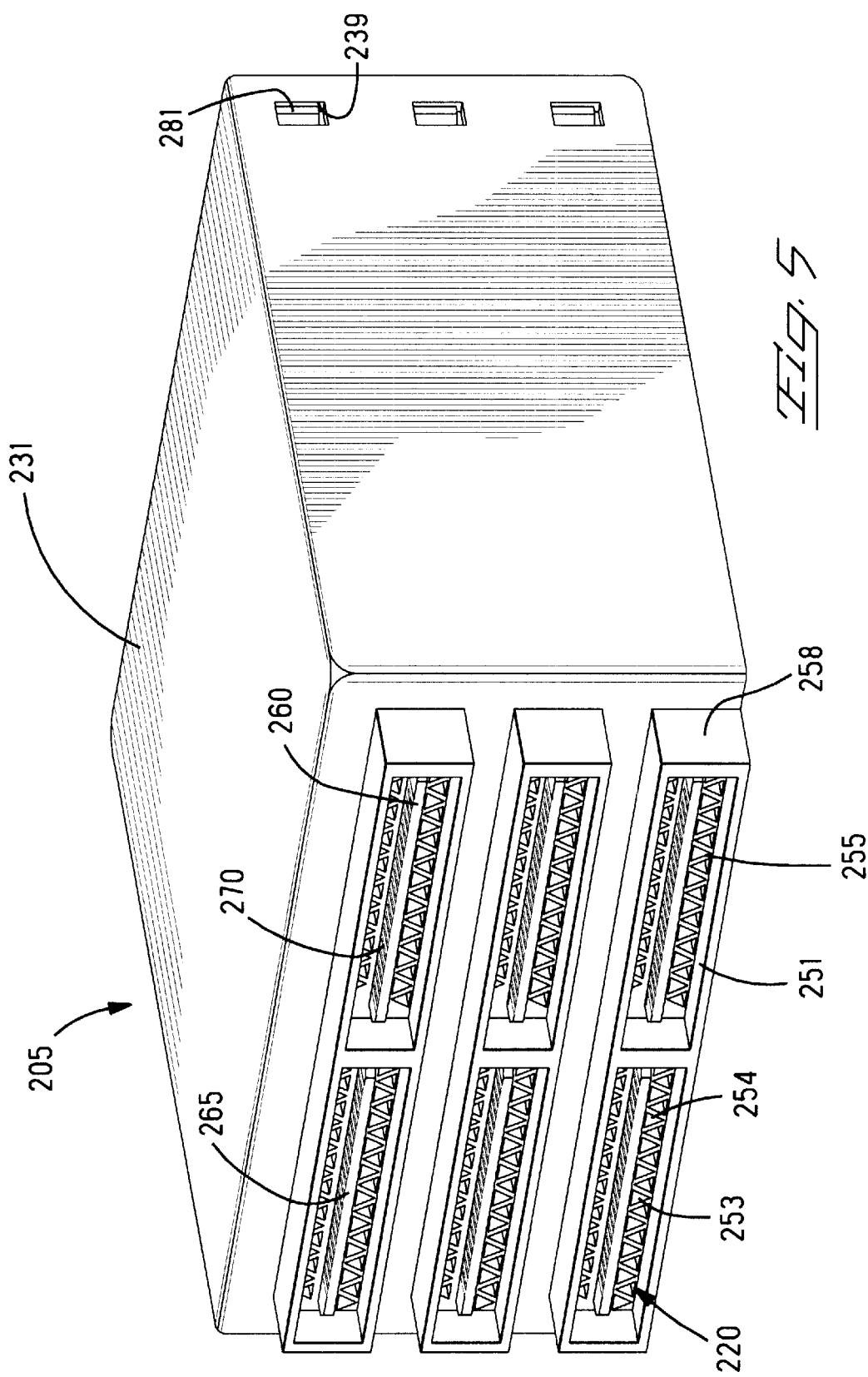

CIRCUIT DEVICE

FIELD OF THE INVENTION

The present invention relates to a circuit device, and specifically relates to a circuit device equipped with a circuit board which is mounted in automobiles and which is used for the electrical control of various other devices.

BACKGROUND OF THE INVENTION

Examples of circuit devices are disclosed in Japanese Patent Application No. 7-57830 and Japanese Patent Application No. 8-116178. In the disclosed circuit devices, a plurality of electrical terminals are insert-molded and held inside a dielectric housing. The pads of a circuit board, which are accommodated inside the housing are electrically connected to the terminals. Furthermore, contact sections of the terminals are arranged outside of the housing; together with a portion of the housing, the contact sections engage with a mating connector.

Since the circuit devices described above contain large numbers of parts, the manufacture and assembly of the circuit devices require considerable effort, so that the circuit devices are relatively expensive. A circuit device with a simpler construction which has a smaller number of parts is disclosed in Japanese Patent Application No. 8-185920. In this construction disclosed in this patent application, a circuit board on which electronic parts are mounted is accommodated inside a case, and connector parts which accommodate female terminals that terminate wires are connected to contact pads on the circuit board. In this case, the connector parts are held by being engaged with the case.

However, circuit devices of this type are mounted in automobiles and are used in environments in which violent temperature changes occur. In such cases, the circuit boards contained in such circuit devices undergo deformation as a result of such temperature changes. In the case of a circuit device such as that disclosed in Japanese Patent Application No. 8-185920 described above, there is a danger that faulty contacts between the circuit board and the terminals will be generated by the deformation of the circuit board.

Furthermore, in circuit devices of the type disclosed in Japanese Patent Application No. 8-185920, the circuit board is not stably held inside the case prior to the mounting of the connector parts; as a result, the assembly working characteristics are poor.

Accordingly, the object of the present invention is to provide a circuit device which insures highly reliable electrical connections even when used in environments involving large temperature variations, and which can be easily assembled.

SUMMARY OF THE INVENTION

The present invention provides a circuit device which comprises a circuit board on which electronic parts are mounted and is accommodated inside a case, contact pads are located on an edge of the circuit board, a supporting housing is provided which supports the edge along the direction of length and which is positioned with respect to the case, and a connector, which engages with a mating connector, is formed by the supporting housing and the edge.

Preferably, the supporting housing has a slot in the direction of length, and the slot accommodates the edge of the circuit board.

The supporting housing includes a reinforcing section, which is located along the length of the slot on both sides of the slot.

The edge of the circuit board includes protruding sections which protrude from a main body of the circuit board, and the contact pads are disposed on the protruding sections. It is advisable that the slot be constructed so as to snugly accommodate the protruding sections.

The supporting housing is formed as a separate part from the case. In this case, it is advisable that another member disposed on the supporting housing or the circuit board have a connector which engages with the case.

The supporting housing is formed as an integral unit with the case.

The supporting housing includes a fastening means for fastening the supporting housing to the circuit board. The fastening means may be a screw-fastening structure.

BRIEF DESCRIPTION OF THE DRAWINGS

Embodiments of the present invention will now be described by way of example with reference to the accompanying drawings in which:

FIGS. 1A and 1B illustrate a board assembly used in a circuit device and shows perspective views from the front with FIG. 1A illustrating the state prior to assembly, while FIG. 1B illustrates the state following assembly.

FIGS. 2A and 2B show perspective views of the board assembly of FIG. 1 from the rear with FIG. 2A illustrating the state prior to assembly, while FIG. 2B illustrates the state following assembly.

FIG. 3 is a perspective view showing a circuit device using the board assembly shown in FIGS. 1A–2B with one board assembly being shown in a semi-inserted state.

FIG. 5 shows the state of the circuit device in FIG. 4 following assembly.

FIG. 6 is perspective view of a circuit device constituting a third embodiment of the invention.

DETAILED DESCRIPTION OF THE INVENTION

Figure 1A:
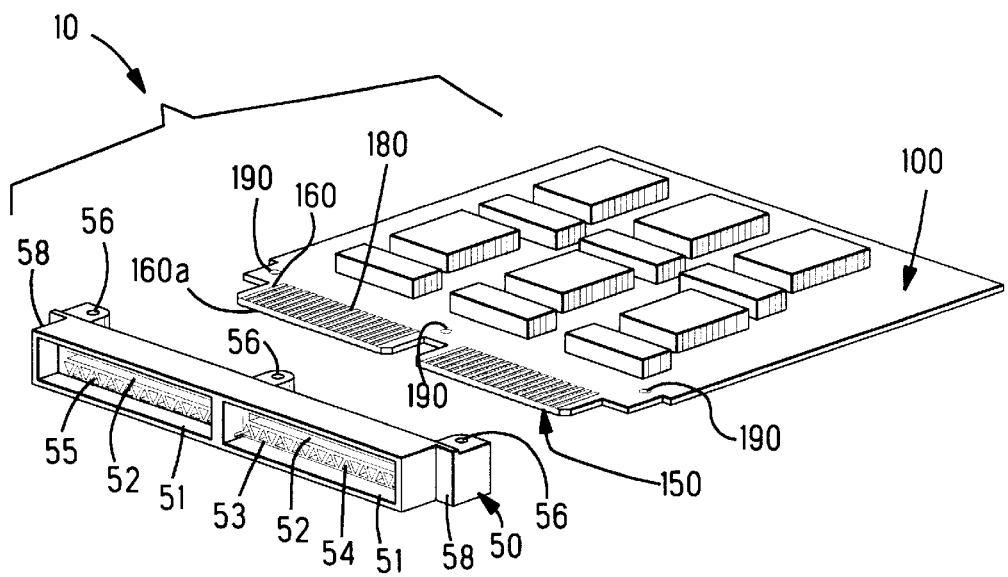

As shown in FIGS. 1A–2B, circuit device 10 has a circuit board 100 on which a plurality of electronic parts are mounted, and a housing 50 which is disposed on an edge 150 of circuit board 100. As shown in FIG. 1A, the housing 50 has two long thin, substantially rectangular frame sections 51. Furthermore, slots 52, which extend in the direction of length, are located inside the respective frame sections 51, and reinforcing sections 55 comprising walls 54 which delineate numerous substantially triangular openings 53 alternately facing upward and downward are disposed on both sides of the slots 52 along the lengths of the slots 52. Three fastening members 56 comprising screw-fastening means are disposed on back sides of the frame sections 51. Furthermore, shoulders 58, which are constructed so that the shoulders face forward, are disposed at both ends of the housing 50.

An edge 150 of the circuit board 100 has two protruding sections 160. A plurality of contact pads 180 are disposed in the direction of width on each of the protruding sections 160. Only one side of each protruding section 160 is shown; however, contact pads 180 may be disposed on both sides of each protruding section 160. Furthermore, three screw holes 190 are located near the ends of the protruding sections 160. The slots 52 in the housing 50 are formed with dimensions which allow snug accommodation of the protruding sections 160 of the circuit board 100 without any looseness.

Figure 1B:
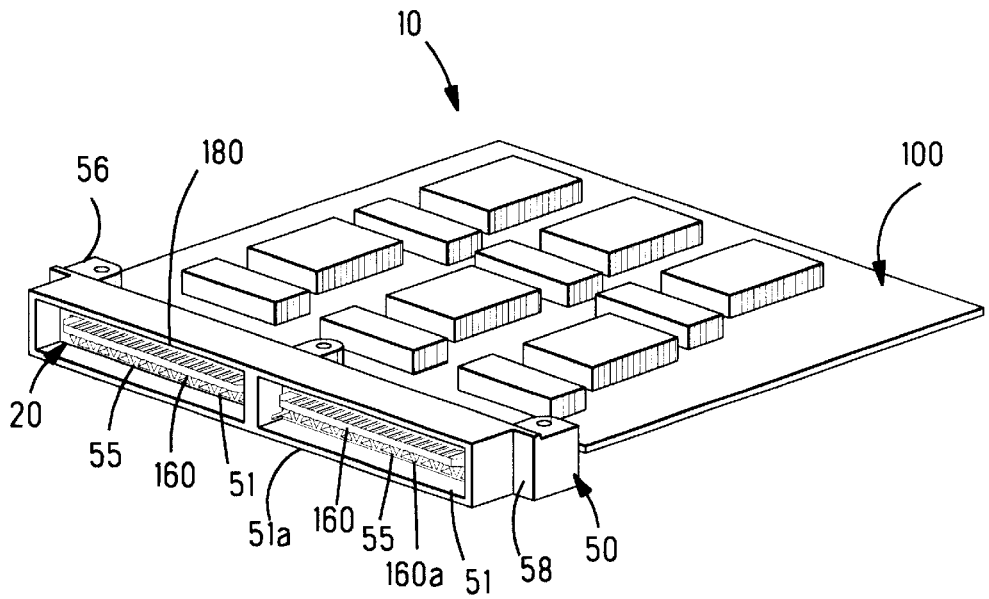
Figure 2A:
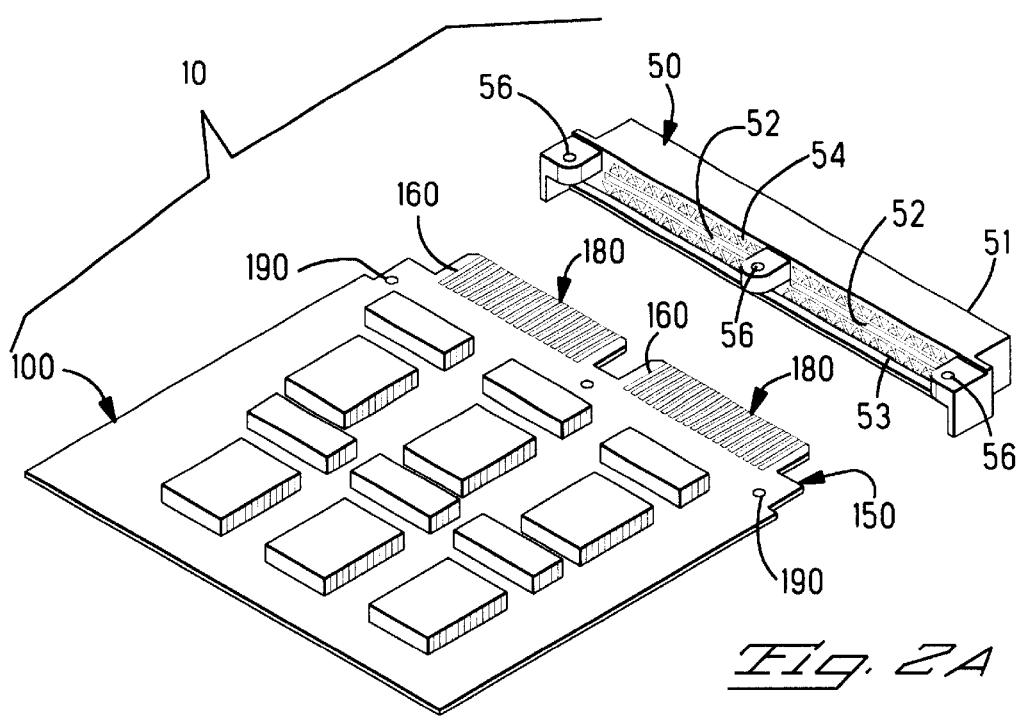
Figure 2B:
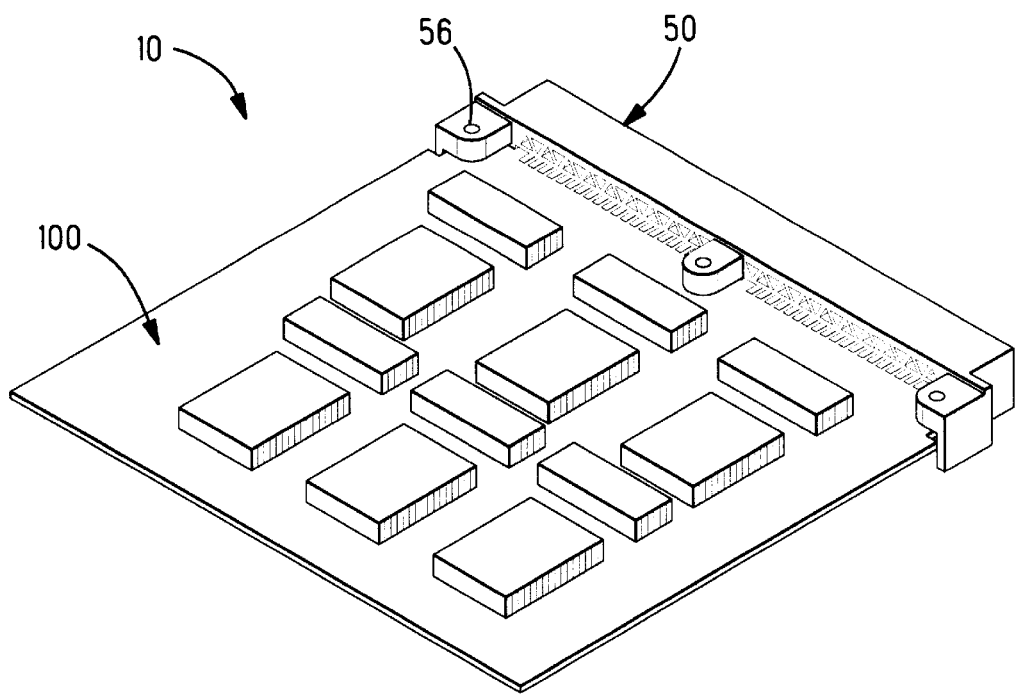

As shown in FIG. 1B and FIG. 2B, when the circuit board 100 is accommodated in the housing 50, the protruding sections 160 of the circuit board 100 are accommodated in the slots 52, and the screw holes 190 in the circuit board 100 are superimposed on the fastening members 56 and fastened by means of screws. As a result, the circuit board assembly 10 is completed. In this case, the frame sections of the housing 50 and the protruding sections 160 of the circuit board 100 form a connector 20 which is engaged with a mating connector. The tip ends 160a of the protruding sections 160 are positioned so that the tip ends 160a do not protrude beyond the ends 51a of the frame sections 51.

As was described above, reinforcing sections 55 are disposed on both sides along the lengths of the slots 52 that accommodate the protruding sections 160 of the edge 150. The reinforcing sections 55 act to maintain the slots 52 in a substantially rectilinear shape. Accordingly, even in cases where deformation caused by thermal expansion occurs in other principal portions of the circuit board 100, the edge 150 constituting the protruding sections 160 of the circuit board 100 is accurately maintained in a flat-plate shape by the reinforcing sections 55.

As shown in FIG. 3, board assemblies 10 are accommodated inside a case 30 so that a circuit device 5 is constructed. As shown, the case 30 can accommodate a plurality of board assemblies 10. The circuit device shown in FIG. 3 accommodates three board assemblies 10; however, this number is arbitrary. The case 30 has latch members 32 formed on its side walls 31; furthermore, the case 30 has guide means, which are used to guide the accommodation of the board assemblies 10, on its inside surfaces (not shown). The board assemblies 10 are inserted from a front end 30a while being guided by the guide means and are fastened in place and held inside the case 30 by the engagement of the latch members 32 and shoulders 58. In this case, the connectors 20 of the respective board assemblies 10 are positioned so that they face outward, thus allowing engagement with mating connectors (not shown).

Figure 4:
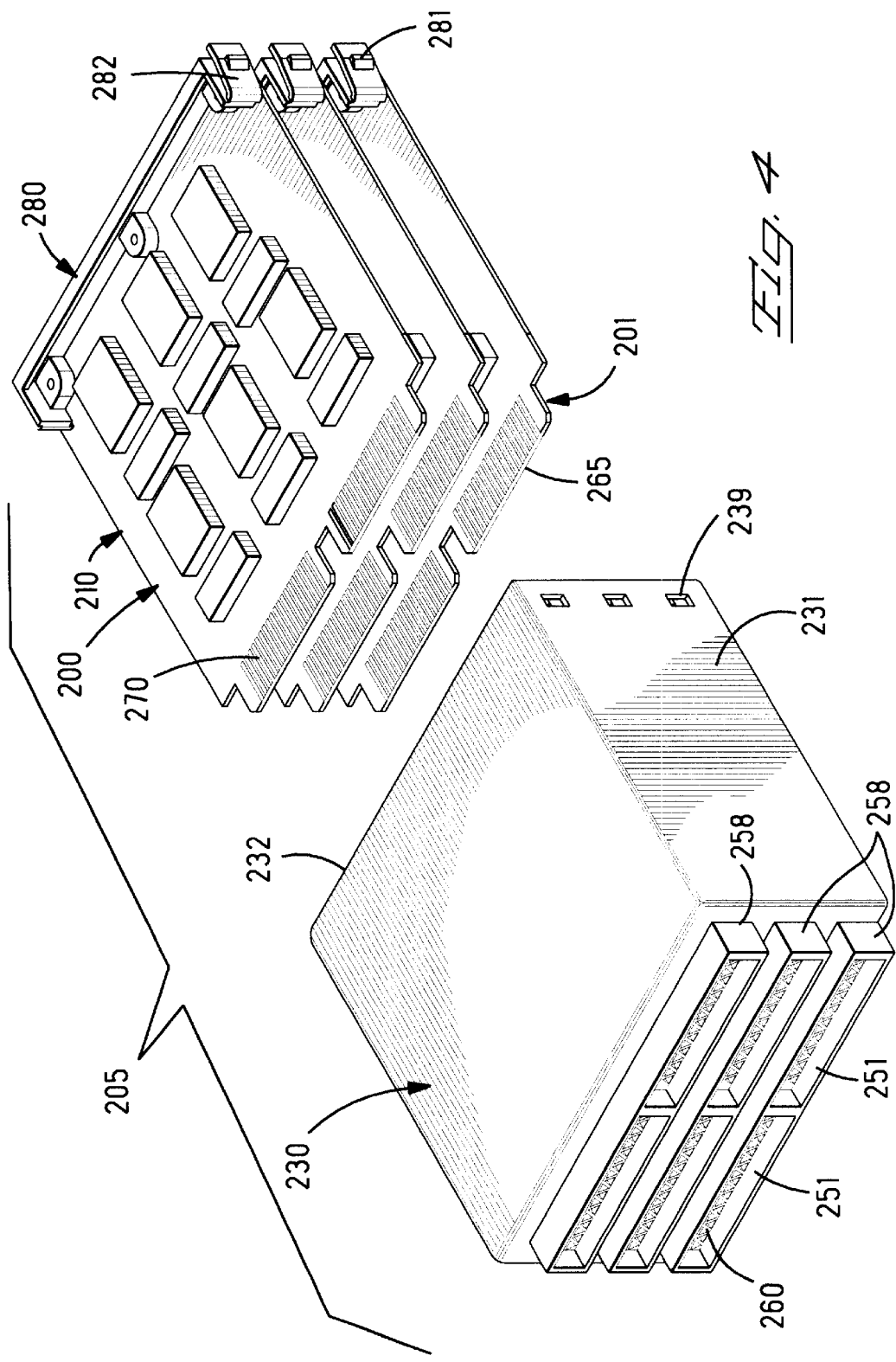
FIG. 4 illustrates a circuit device which constitutes a second embodiment showing the state prior to assembly.

In FIGS. 4 and 5, the circuit device 205 includes a case 230 and three board assemblies 210. A point to be noted here is that the board assemblies 210 do not include housings 50 such as those possessed by the board assemblies 10 described above; instead, structures resembling the housings 50 are formed as integral parts of the case 230. Specifically, the case 230 has a case section 231 which accommodates a plurality of board assemblies 210, and board-supporting housings 258. Each board-supporting housing 258 has two frame sections 251. A slot 260 resembling the slots 52 of the housing 50 is formed on the inside of each of the two frame sections 251, and reinforcing sections 255 comprising walls 254, which delineate substantially triangular openings 253, are disposed on both sides along the lengths of the slots 260.

Circuit board 200 of each board assembly 210 has protruding sections 265 on an edge 201; contact pads 270 are located along the direction of width of each of the protruding sections 265. Furthermore, a latching member 280 which is screw-fastened to the corresponding circuit board 200 is disposed on a rear edge of the circuit board 200 located on the opposite side from the edge 201. A resilient latch arm 282, which includes a projection 281, is disposed at one end of each latching member 280.

The board assemblies 210 are inserted into the case 230 from a rear end 232 of the case 230. Guide means (not shown) are located inside the case section 231 of the case 230; as a result of the guiding action of the guide means, the board assemblies 210 are smoothly inserted into the case section 231. As shown in FIG. 5, when the board assemblies 210 are completely accommodated inside the case 230, the protruding sections 265 are snugly accommodated inside the slots 260. Furthermore, the projections 281 and apertures 239 of the case 230 are engaged so that the board assemblies 210 are latched in place and held inside the case 230. As shown in FIGS. 4 and 5, connectors 220, which engage with mating connectors, are formed by the protruding sections 265 and the frame sections 251. The dimensional relationship between the slots 260 and the protruding sections 265 is similar to the relationship between the slots 52 and protruding sections 160 shown in the first embodiment, so that the protruding sections 265 are firmly held inside the slots 260. In particular, the reinforcing sections 255 function in a manner similar to that of the reinforcing sections 55, so that the protruding sections 265 on the edges 201 are maintained in a substantially flat-plate shape even in cases where the circuit boards 200 may undergo deformation as a result of the effects of heat. Furthermore, although this is not shown, it would also be possible to dispose other fastening means which fasten the circuit boards 200 to the case 230 in positions along the edges of the circuit boards 200, so that the circuit boards 200 of the board assemblies 210 are fastened even more firmly to the case 230.

The circuit device 305 of a third embodiment shown in FIG. 6 is a modification of the circuit device 205 of the second embodiment, and it has a board assembly 310 and a case 330. The case 330 has a case section 331, which accommodates the board assembly 310, and a board-supporting housing 358, which has two frame sections 351. Slots 352, which snugly accommodate protruding sections 360 forming portions of the edge 303 of the circuit board 300 of the board assembly 310, are formed inside the frame sections 351. Contact pads 362 are located on the protruding sections 360, and the frame sections 351 and protruding sections 360 form a connector 320. Furthermore, reinforcing sections 355 similar to the reinforcing sections 55 and 255 of the first and second embodiments are located on both sides along the lengths of the slots 352.

The circuit device 305 differs from the circuit device 205 in that fastening members 361 using screw fastening means are disposed in the vicinity of the frame sections 351. Since the circuit board 300 of the board assembly can be firmly held in the vicinity of the connector 320, deformation of the circuit board 300 in the vicinity of the edge 303 including the protruding sections 360 can be more effectively prevented. A latching member with a latch arm like latching member 280 is mounted onto an inner end of circuit board 300 to latchably mount the board assembly 310 in case 330.

Circuit devices constituting preferred embodiments of the invention were described above. However, these embodiments are merely examples; various modifications and alterations may be made by a person skilled in the art.

The circuit device of the present invention comprises a circuit board on which electronic parts are mounted and is accommodated inside a case, contact pads are located on an edge of the circuit board, a supporting housing is provided which supports the edge along the direction of length thereof and which is positioned with respect to the case, and a connector which engages with a mating connector is formed by the supporting housing and the edge. Accordingly, assembly and manufacture of the circuit device can easily be accomplished; furthermore, circuit board deformation in the vicinity of the connector can be effectively prevented even in the case of use in environments with large temperature differences so that highly reliable electrical connections with mating connectors can be maintained.

What is claimed is:

1. A circuit device, comprising:

a circuit board on which electrical parts are mounted;

a case in which the circuit board is disposed;

contact pads located on a mating edge of the circuit board;

a board-supporting housing for supporting the circuit board, the board-supporting housing having a slot for receiving the mating edge therethrough, the board-supporting housing and the mating edge forming an electrical connector, the mating edge extending through the slot and having electrical contacts provided thereon;

latching members on the case and the circuit board latching the circuit in the case;

whereby when a mating electrical connector is mated with the board-supporting housing and the mating edge, the contacts provided on the mating edge electrically engage mating contacts of the mating connector and the board-supporting housing mechanically engages a mating housing of the mating connector.

2. A circuit device as claimed in claim 1, wherein the board-supporting housing is secured on the circuit board.

3. A circuit device as claimed in claim 1, wherein the board-supporting housing is integral with the case.

4. A circuit device as claimed in claim 1, wherein the latch members include a latch member on the case engaging a shoulder on the board-supporting housing.

5. A circuit device as claimed in claim 1, wherein the latch members include a latching member mounted on a rear edge of the circuit board, a resilient latch arm having a projection on the latching member, and an aperture in the case in which the projection is disposed.

6. A circuit device as claimed in claim 1, wherein said board-supporting housing has reinforcing sections on each side of said slot.

7. A circuit device, comprising:

a circuit board having contact pads disposed on a mating edge;

a board-supporting housing having a slot through which the mating edge is disposed, the board-supporting housing and the mating edge thereby defining a connector for engaging a mating connector;

latching shoulders disposed on ends of the board-supporting housing;

a case for receiving the circuit board, wherein the case has latches which engage the latching shoulder of the board-supporting housing;

whereby when the connector is mated with the board-supporting housing and the mating edge, the contact pads provided on the mating edge electrically engage mating contacts of the mating connector and the board-supporting housing mechanically engages a mating housing of the mating connector.

8. A circuit device as claimed in claim 7, wherein the board-supporting housing has fastening members for fastening the board-supporting housing to the circuit board.

9. A circuit device as claimed in claim 7, wherein the slot is flanked with reinforcing sections for maintaining an original shape of the slot.

10. A circuit device as claimed in claim 9, wherein the reinforcing sections are interconnected walls which define substantially triangular openings.

11. A circuit device, comprising:

a circuit board having contact pads disposed on a mating edge;

a board-supporting housing having a slot through which the mating edge is disposed, the board-supporting housing and the mating edge thereby defining a connector for engaging a mating connector; such that the contact pads are moved into electrical engagement with mating contacts when the mating connector is moved into engagement with this connector;

reinforcing sections are provided on the board-supporting housing proximate the slot, the reinforcing sections maintain the dimensions of the slot, whereby as the circuit board is mechanically deformed, the mating edge and contact pads are accurately maintained in position for mating to the mating connector.

12. A circuit device, as claimed in claim 11, wherein the reinforcing sections are interconnected walls which define substantially triangular openings.

* * * * *